United States Patent
Wu et al.

(10) Patent No.: US 12,413,211 B2
(45) Date of Patent: Sep. 9, 2025

(54) FREQUENCY MIXING CIRCUIT WITH MULTI-TRANSISTOR ARCHITECTURE

(71) Applicant: Realtek Semiconductor Corp., HsinChu (TW)

(72) Inventors: Yi-Ching Wu, HsinChu (TW); Chia-Jun Chang, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 160 days.

(21) Appl. No.: 18/242,549

(22) Filed: Sep. 6, 2023

(65) Prior Publication Data

US 2024/0146287 A1 May 2, 2024

(30) Foreign Application Priority Data

Oct. 26, 2022 (TW) .................................. 111140597

(51) Int. Cl.
*H03K 5/00* (2006.01)
*H03K 17/56* (2006.01)

(52) U.S. Cl.
CPC ......... *H03K 5/00006* (2013.01); *H03K 17/56* (2013.01)

(58) Field of Classification Search
CPC ........... H03D 7/125; H03D 2200/0074; H03K 5/00006; H03K 17/56
See application file for complete search history.

(56) References Cited

U.S. PATENT DOCUMENTS

| | | | |
|---|---|---|---|
| 6,130,574 A * | 10/2000 | Bloch | H02M 3/073 327/536 |
| 6,574,457 B1 | 6/2003 | Salminen | |
| 2008/0024223 A1 * | 1/2008 | Park | H03F 3/16 330/277 |
| 2018/0041167 A1 * | 2/2018 | Belkin | H03D 7/1408 |
| 2019/0020311 A1 * | 1/2019 | Kang | H03D 7/1466 |

FOREIGN PATENT DOCUMENTS

TW 202029641 A 8/2020

* cited by examiner

*Primary Examiner* — Quan Tra
(74) *Attorney, Agent, or Firm* — Winston Hsu

(57) ABSTRACT

A frequency mixing circuit includes: a first transistor and a second transistor. The first transistor has a control terminal, a first terminal and a second terminal. The control terminal of the first transistor is configured to receive an oscillation signal, the first terminal of the first transistor is configured to output a mixed signal, and the second terminal of the first transistor is configured to receive a source signal. The second transistor has a control terminal, a first terminal and a second terminal. The control terminal of the second transistor is coupled to the second terminal of the first transistor, the first terminal of the second transistor is coupled to the first terminal of the first transistor, and the second terminal of the second transistor is coupled to the control terminal of the first transistor.

9 Claims, 6 Drawing Sheets

FREQUENCY MIXING CIRCUIT WITH MULTI-TRANSISTOR ARCHITECTURE

BACKGROUND OF THE INVENTION

1. Field of the Invention

The present invention relates to frequency mixing, and more particularly to a frequency mixing circuit with a multi-transistor structure.

2. Description of the Prior Art

In the field of circuit design, various circuits rely on frequency mixing circuits to adjust signal frequencies to reduce or increase a frequency of an input signal to a target frequency range for the purpose of signal processing. A frequency mixing circuit is typically implemented using a single transistor. In partial structure of an external digital pre-distortion (EDPD) circuit as shown in FIG. 1, a frequency mixing circuit 10 with a single-transistor structure is utilized to perform a frequency down-conversion on signals. Specifically, a transistor M1 receives an oscillation signal LO on a gate G and mixes a signal on a drain D with the oscillation signal LO, thereby to output a mixed signal on a source S. However, such design leads to a trade-off between noise figure (NF) and counter third-order intermodulation (CIM3). That is, if it is desired to optimize the noise performance and the CIM3 performance by enlarging a size of the single transistor M1 in the frequency mixing circuit 10 (such as, enlarging the gate length/width or increasing finger number), it causes a DC offset at an output of a transimpedance amplifier (TIA) in the EDPD circuit to exceed an allowable range associated with the manufacturing process. For example, in a specific 55 nm manufacturing process, the allowable range of the DC offset should be within ±25 mV. Therefore, there is a need to provide an innovative frequency mixing circuit to address this problem.

SUMMARY OF THE INVENTION

In view of this, it is one object of the present invention to provide a frequency mixing circuit with a multi-transistor structure, which can improve anti-interference ability against high-order harmonics without increasing sizes of the transistors. As the frequency mixing circuit with multi-transistor structure provided by the present invention ensures some transistors not to be conductive, additional noises will not be introduced excessively, such that severe degradation in the noise figure can be prevented. Since sizes of the transistors are reasonably controlled in the present invention, the undesired DC offset problem can be addressed.

According to one embodiment, a frequency mixing circuit is provided. The frequency mixing circuit comprises: a first transistor and a second transistor. The first transistor has a control terminal, a first terminal and a second terminal. The control terminal of the first transistor is configured to receive an oscillation signal, the first terminal of the first transistor is configured to output a mixed signal, and the second terminal of the first transistor is configured to receive a source signal. The second transistor has a control terminal, a first terminal and a second terminal. The control terminal of the second transistor is coupled to the second terminal of the first transistor, the first terminal of the second transistor is coupled to the first terminal of the first transistor, and the second terminal of the second transistor is coupled to the control terminal of the first transistor.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth in order to provide a thorough understanding of the present embodiments. It will be apparent, however, to one having ordinary skill in the art that the specific detail need not be employed to practice the present embodiments. In other instances, well-known materials or methods have not been described in detail in order to avoid obscuring the present embodiments.

Reference throughout this specification to "one embodiment" or "an embodiment" means that a particular feature, structure or characteristic described in connection with the embodiment or example is included in at least one embodiment of the present embodiments. Thus, appearances of the phrases "in one embodiment" or "in an embodiment" in various places throughout this specification are not necessarily all referring to the same embodiment. Furthermore, the particular features, structures or characteristics may be combined in any suitable combinations and/or sub-combinations in one or more embodiments.

Figure 2:
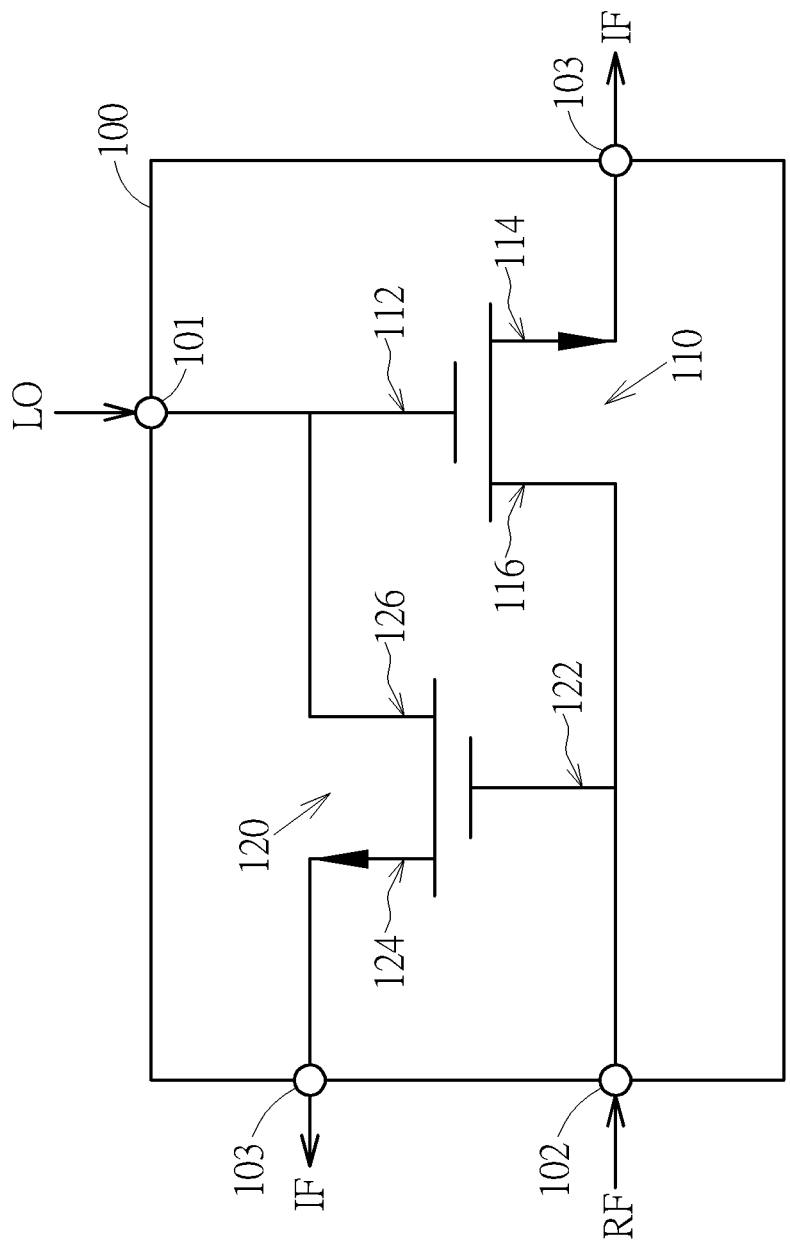
FIG. 2 illustrates a structure of a frequency mixing circuit with a multi-transistor structure according to one embodiment of the present invention.

FIG. 2 illustrates a structure diagram of a frequency mixing circuit with multi-transistor structure according to one embodiment of the present invention. The frequency mixing circuit 100 has an oscillation signal input terminal 101, a source signal input terminal 102 and a mixed signal output terminal 103. The oscillation signal input terminal 101 is configured to receive an oscillation signal LO, the source signal input terminal 102 is configured to receive a source signal RF, and the mixed signal output terminal 103 is configured to output a mixed signal IF. The frequency mixing circuit 100 is configured to mix the source signal RF and the oscillation signal LO, thereby to adjust a frequency of the source signal RF. Accordingly, the frequency of the mixed signal IF can fall within a target frequency range.

The frequency mixing circuit 100 includes a first transistor 110 and a second transistor 120. The first transistor 110 has a control terminal 112 (e.g., gate), a first terminal 114 (e.g., source) and a second terminal 116 (e.g., drain). The second transistor 120 has a control terminal 122 (e.g., gate), a first terminal 124 (e.g., source) and a second terminal 126 (e.g., drain). Moreover, the control terminal 112 of the first transistor 110 is coupled to the second terminal 126 of the second transistor 120, the first terminal 114 of the first transistor 110 is coupled to the first terminal 124 of the second transistor 120, and the second terminal 116 of the first transistor 110 is coupled to the control terminal 122 of the second transistor 120. On the other hand, the control terminal 112 of the first transistor 110 and the second terminal 126 of the second transistor 120 are coupled to the oscillation signal input terminal 101 of the frequency mixing circuit 100 to receive the oscillation signal LO. The first terminal 114 of the first transistor 110 and the first terminal 124 of the second transistor 120 are coupled to the mixed signal output terminal 103 of the frequency mixing circuit 100 to output the mixed signal IF. The second terminal 116 of the first transistor 110 and the control terminal 122 of the second transistor 120 are coupled to the source signal input terminal 102 of the frequency mixer circuit 100 to receive the source signal RF.

Figure 3:
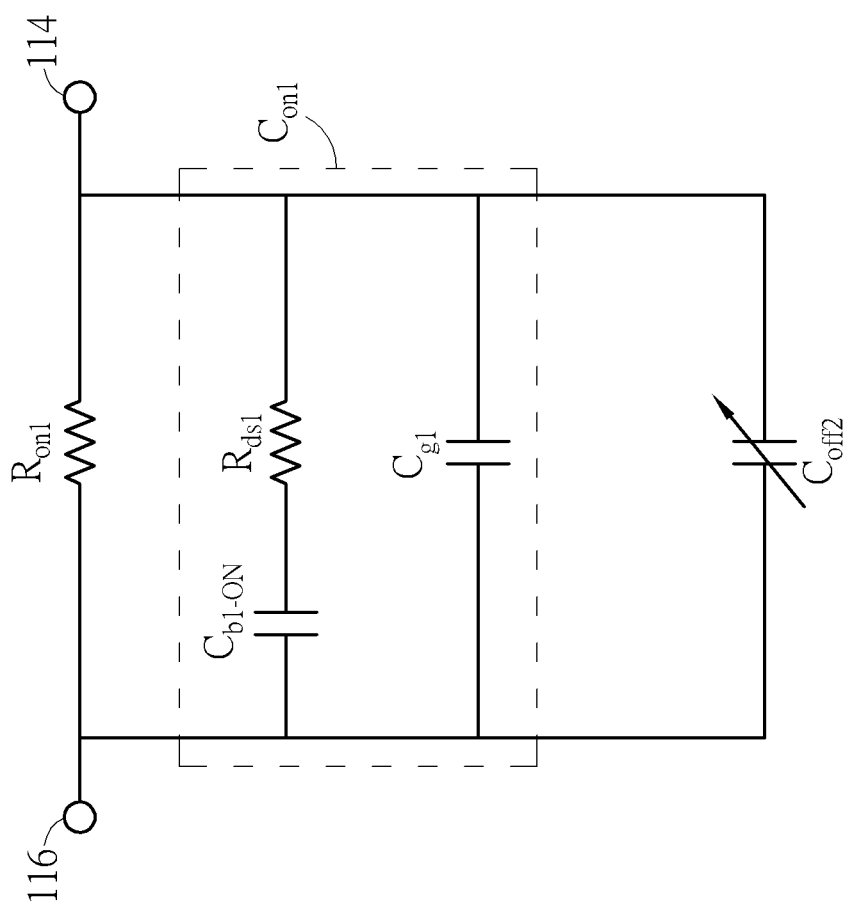
FIG. 3 illustrates an equivalent circuit model of the frequency mixing circuit with the multi-transistor structure when the transistor is conductive.
Figure 4:
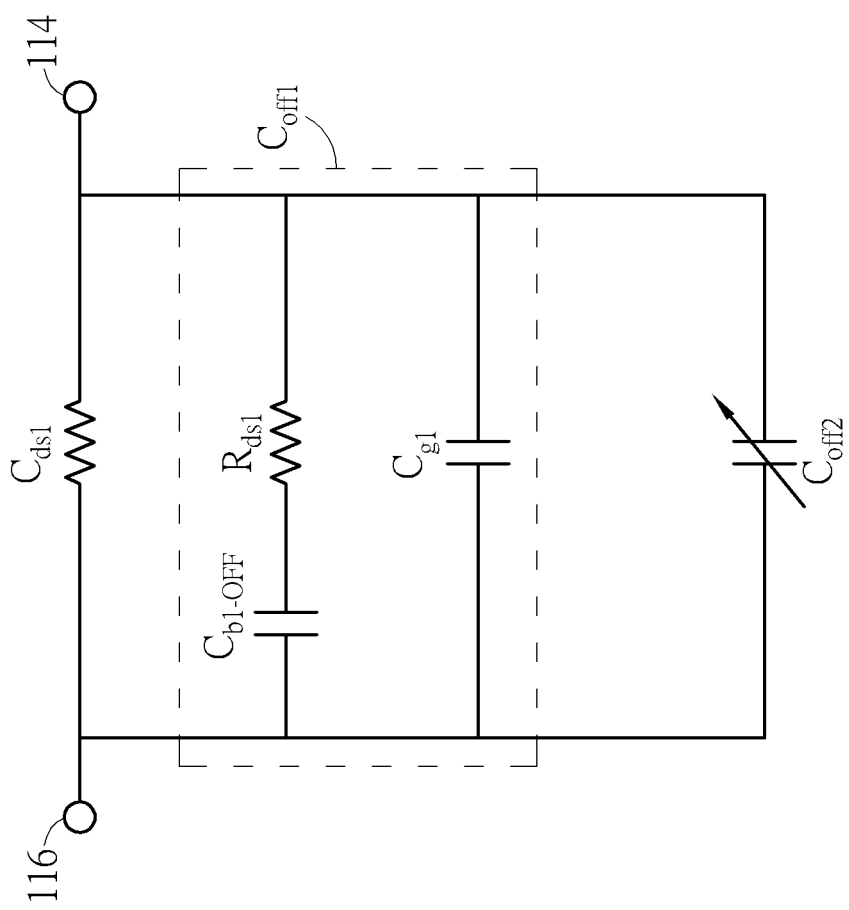
FIG. 4 illustrates an equivalent circuit model of the frequency mixing circuit with the multi-transistor structure when the transistor is not conductive.

In one embodiment, the oscillation signal LO has a high level HL and a low level LL. Since the control terminal 112 of the first transistor 110 receives the oscillation signal LO, these two levels of the oscillation signal LO affect a conduction state of the first transistor 110. FIG. 3 illustrates an equivalent circuit model of the frequency mixing circuit 100 when the oscillation signal LO is at the high level HL. FIG. 4 illustrates an equivalent circuit model of the frequency mixing circuit 100 when the oscillation signal LO is at the low level LL.

Regarding the equivalent circuit model shown by FIG. 3, the high level HL of the oscillation signal LO allows the first transistor 110 to enter a conductive state. Therefore, circuit characteristic between the first terminal 114 (source) and the second terminal 116 (drain) of the first transistor 110 is equivalent to a (parallel) combination of an on-resistance $R_{on1}$ and a capacitive element $C_{on1}$. The capacitive element $C_{on1}$ formed when the transistor 110 is conductive may be further equivalent to a (parallel) combination of: 1) a capacitive element $C_{b1\text{-}ON}$ and a resistive element $R_{ds1}$ that are connected in series; and 2) a capacitive element $C_{g1}$. In addition, since the source signal RF and the mixed signal IF have the same DC level (typically 0.5V), a voltage Vgs (i.e., the gate-to-source voltage) of the second transistor 120 will be 0, such that the second transistor 120 will not be conductive and become capacitive. Moreover, circuit characteristic of the second transistor 120 between the first terminal 114 and the second terminal 116 of the first transistor 110 will be equivalent to a capacitive element $C_{off2}$. A capacitance of the capacitive element $C_{off2}$ formed by the second transistor 120 varies with the voltage level of the oscillation signal LO. Typically, the voltage Vds (i.e., the drain-to-source voltage) of the second transistor 120 will vary between −0.5V to +0.5V, which will affect the capacitance of the capacitive element $C_{off2}$.

On the other hand, regarding the equivalent circuit model shown by FIG. 4, the low level LL of the oscillation signal LO allows the first transistor 110 to enter an off state. Therefore, the circuit characteristic between the first terminal 114 (source) and the second terminal 116 (drain) of the transistor 110 is equivalent to a (parallel) combination of: a capacitive element $C_{ds1}$ and a capacitive element $C_{off1}$. The capacitive element $C_{off1}$ is further equivalent to a (parallel) combination of: 1) a capacitive element $C_{b1\text{-}OFF}$ and a resistive element $R_{ds1}$ that are connected in series; and 2) a capacitive element $C_{g1}$. In such situation, the second transistor 120 is still not conductive and remains capacitive. A capacitance of the capacitive element $C_{off2}$ varies with the level of the oscillation signal LO. During the operation of the frequency mixing circuit 100, the capacitive element $C_{off2}$ formed by the second transistor 120 can help to eliminate energy of high-order harmonics (e.g., the second harmonic (at double frequency) and the third harmonic (at triple frequency)), thereby optimizing CIM3 performance. Please refer to FIG. 5 and FIG. 6 for further understandings.

Figure 1:
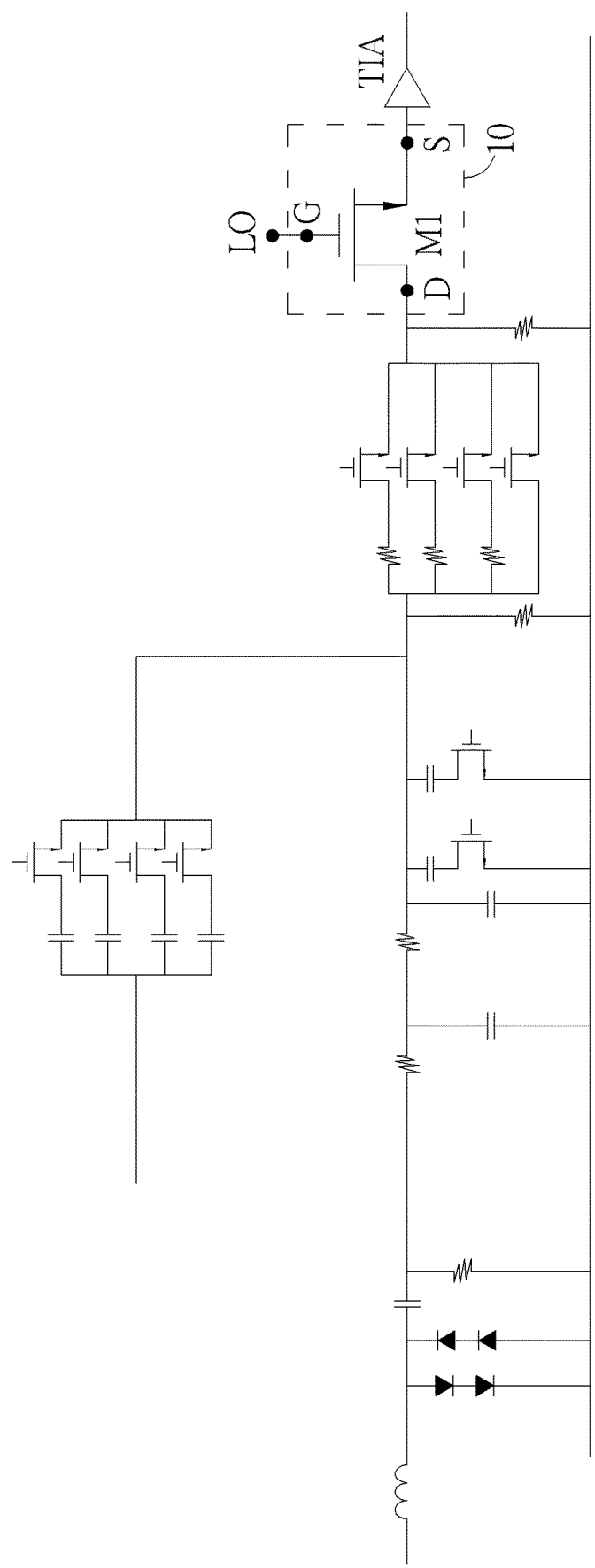
FIG. 1 illustrates an application of a conventional frequency mixing circuit.
Figure 5:
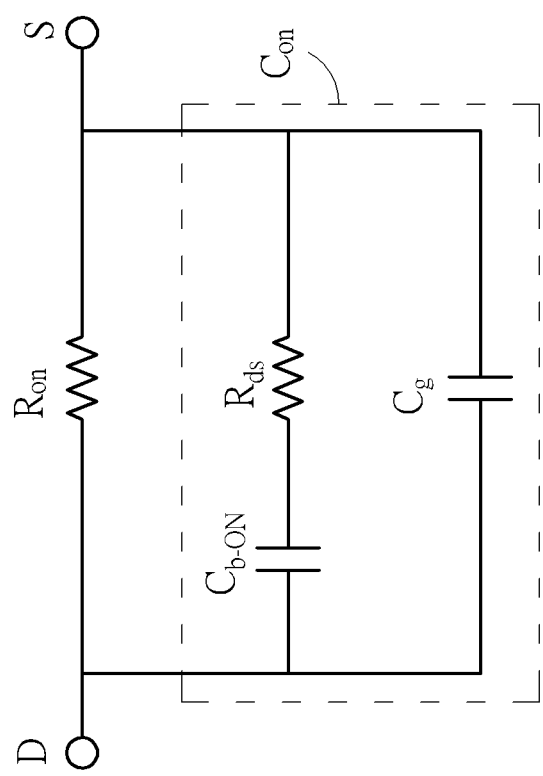
FIG. 5 illustrates an equivalent circuit model of the frequency mixing circuit with the single-transistor structure when the transistor is conductive.
Figure 6:
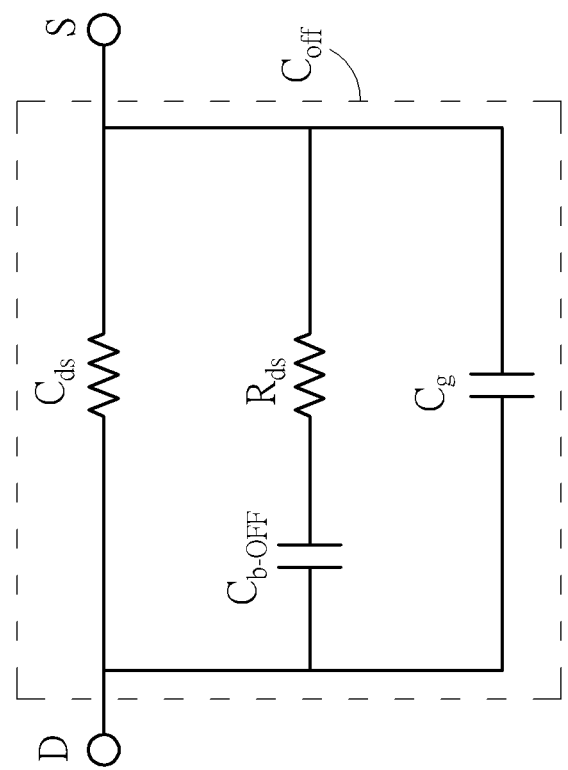
FIG. 6 illustrates an equivalent circuit model of the frequency mixing circuit with the single-transistor structure when the transistor is not conductive.

FIG. 5 and FIG. 6 respectively illustrate equivalent circuit models of the frequency mixing circuit 10 with the single-transistor structure of FIG. 1. FIG. 5 illustrates an equivalent circuit model of the frequency mixing circuit 10 when the oscillation signal LO is at the high level HL. FIG. 6 illustrates shows an equivalent circuit model of the frequency mixing circuit 10 when the oscillation signal LO is at the low level LL.

Regarding the equivalent circuit model shown by FIG. 5, the high level HL of the oscillation signal LO allows the transistor M1 to enter a conductive state. Therefore, circuit characteristic between a source S and a drain D of the transistor M1 is equivalent to a (parallel) combination of an on-resistance $R_{on}$ and a capacitive element $C_{on}$. The capacitive element $C_{on}$ formed when the transistor M1 is conductive is equivalent to a (parallel) combination of: 1) a capacitive element $C_{b\text{-}ON}$ and a resistive element $R_{ds}$ that are connected in series and; 2) a capacitive element $C_g$. Regarding the equivalent circuit model in FIG. 6, the low level LL of the oscillation signal LO allows the transistor M1 to enter an off state. Thus, the circuit characteristic between the source S and the drain D of transistor M1 is equivalent to a (parallel) combination of a capacitive element $C_{ds}$ and a capacitive element $C_{off}$. The capacitive element $C_{off}$ is further equivalent to a (parallel) combination of: 1) a capacitive element $C_{b\text{-}OFF}$ and a resistive element $R_{ds}$ that are connected in series and; 2) a capacitive element $C_g$. It can be understood from FIG. 5 and FIG. 6 that the frequency mixing circuit 10 with the single-transistor structure lacks anti-interference ability against high-order harmonics due to lack of the capacitive element $C_{off2}$ to eliminate energy of the high-order harmonics. Hence, the CIM3 performance of the frequency mixing circuit 10 is poor.

Furthermore, regarding dimension parameters of the transistors, a size of the first transistor 110 can be selected based on actual requirements of external circuits, and a size of the second transistor 120 can be selected based on the following principles to obtain better performance. In one embodiment, the size of the second transistor 120 may be smaller than that of the first transistor 110. In one embodiment, a gate length of the first transistor 110 may be identical to that of the second transistor 120. In one embodiment, both of the gate lengths of the first transistor 110 and the second transistor 120 may be selected according to (e.g., equal to) a minimum gate length of a manufacturing process that first transistor 110 and the second transistor 120 are produced by. In one embodiment, a gate width of the second transistor 120 may be selected according to (e.g. equal to) a minimum gate width of a manufacturing process that the second transistor 120 is produced by. In one embodiment, the gate width of the second transistor 120 may be smaller than that of the first transistor 110. In one embodiment, a finger number of the second transistor 120 (i.e., the second transistor 120 has a multi-finger gate) may be slightly smaller than or equal to that of the first transistor 110 (i.e., the first transistor 110 has a multi-finger gate). In one embodiment, channel types of the first transistor 110 and the second transistor 120 are identical.

Since the second transistor 120 remains in the non-conductive state during the operation of the frequency mixing circuit 100, the second transistor 120 introduces capacitance only for the frequency mixing circuit 100, which will not lead to an increase in noise. Moreover, through the capacitance provided by the second transistor 120, the energy of the high-order harmonics can be effectively eliminated, thereby improving the CIM3 performance without introducing additional noise.

Table 1 shows comparison between performances of the frequency mixing circuit (with the multi-transistor structure) provided by present invention and the conventional frequency mixing circuit (with the single-transistor structure) with different dimension parameter selections. Specifically, regarding the frequency mixing circuit with the multi-transistor structure listed in the first column, the gate width of the second transistor 120 is 600 nm, the gate width of the first transistor 110 is 2 um, the finger number of the second transistor 120 is 17, and the finger number of the first transistor 110 is 19. Regarding the frequency mixing circuit with the multi-transistor structure listed in the second column, the gate width of the second transistor 120 is 600 nm, the gate width of the first transistor 110 is 2 um, the finger number of the second transistor 120 is 19 and the finger number of the first transistor 110 is 19. It can be found in the Table 1 that for HBNF (which regards the noise figure) the present invention does not cause excessive degradation in the noise performance when compared to the frequency mixing circuit with the single-transistor structure. In terms of CIM2 and CIM3, there is a significant improvement. Furthermore, regarding DC offset I and DC offset Q (which regards the DC offset voltage), the present invention also controls the DC offset voltage to fall within a reasonable range.

TABLE 1

|  | 1. Multi-transistor structure Width: 600 nm:2 um Finger: 17:19 | 2. Multi-transistor structure Width: 600 nm:2 um Finger: 19:19 | 3. Single-transistor structure |
| --- | --- | --- | --- |
| HBNF (dB) | 35.04 | 35.08 | 34.43 |
| CIM2 (dBc) | 98.52 | 98.51 | 87.35 |
| CIM3 (dBc) | 90.45 | 89.97 | 80.05 |
| DC offset I (mV) | 9.672 | 9.718 | 10.96 |
| DC offset Q (mV) | 13.29 | 13.38 | 9.176 |

In view of above, the frequency mixing circuit 100 proposed by the present invention can effectively suppress the high-order harmonics, thereby improving the CIM3 performance. Moreover, the present invention does not lead to excessive degradation in the noise performance due to the multi-transistor structure. The present invention also solves the problem that the DC offset voltage goes higher than expected when increasing the size of the transistor under the single-transistor structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency mixing circuit, comprising:
a first transistor, having a control terminal, a first terminal and a second terminal, wherein the control terminal of the first transistor is configured to receive an oscillation signal, the first terminal of the first transistor is configured to output a mixed signal, and the second terminal of the first transistor is configured to receive a source signal; and
a second transistor, having a control terminal, a first terminal and a second terminal, wherein the control terminal of the second transistor is coupled to the second terminal of the first transistor, the first terminal of the second transistor is coupled to the first terminal of the first transistor, and the second terminal of the second transistor is coupled to the control terminal of the first transistor;
wherein when the frequency mixing circuit is operated to perform frequency mixing, the second transistor remains in a non-conductive state.

2. The frequency mixing circuit of claim 1, wherein a finger number of the second transistor is smaller than or equal to a finger number of the first transistor.

3. The frequency mixing circuit of claim 1, wherein a gate width of the second transistor is smaller than a gate width of the first transistor.

4. The frequency mixing circuit of claim 1, wherein a gate width of the second transistor is a minimum gate width of a manufacturing process that the second transistor is produced by.

5. The frequency mixing circuit of claim 1, wherein a gate length of the first transistor is identical to a gate length of the second transistor.

6. The frequency mixing circuit of claim 1, wherein gate lengths of the first transistor and the second transistor are identical to a minimum gate length of a manufacturing process that the first transistor and the second transistor are produced by.

7. The frequency mixing circuit of claim 1, wherein a size of the second transistor is smaller than a size of the first transistor.

8. The frequency mixing circuit of claim 1, wherein a channel type of the first transistor is identical to a channel type of the second transistor.

9. The frequency mixing circuit of claim 1, wherein when the frequency mixing circuit is operated to perform frequency mixing, the second transistor is capacitive only.

\* \* \* \* \*